United States Patent [19]

Benasutti

[11] 4,390,220
[45] Jun. 28, 1983

[54] ELECTRICAL CONNECTOR ASSEMBLY FOR AN INTEGRATED CIRCUIT PACKAGE

[75] Inventor: John E. Benasutti, Lansdale, Pa.

[73] Assignee: Burroughs Corporation, Detroit, Mich.

[21] Appl. No.: 250,424

[22] Filed: Apr. 2, 1981

[51] Int. Cl.³ .................................................. H01R 13/62
[52] U.S. Cl. ................................ 339/17 CF; 339/75 M; 339/175 C; 174/52 FP
[58] Field of Search .......... 339/17 CF, 75 M, 175 M; 174/52 FP

[56] References Cited

U.S. PATENT DOCUMENTS

| | | | |
|---|---|---|---|
| 3,883,207 | 5/1975 | Tomkiewicz | 339/75 M |
| 3,885,173 | 5/1975 | Lee | 339/17 CF X |
| 3,904,262 | 9/1975 | Cutchaw | 339/17 CF |
| 4,018,494 | 4/1977 | Scheingold et al. | 339/17 CF |
| 4,059,323 | 11/1977 | Babuka et al. | 339/17 CF X |
| 4,293,175 | 10/1981 | Cutchaw | 339/17 CF X |

Primary Examiner—Willie G. Abercrombie
Attorney, Agent, or Firm—Francis A. Varallo; Kevin R. Peterson

[57] ABSTRACT

The present disclosure describes a connector assembly especially suited for a large scale integration (LSI) package. The assembly includes a housing to accommodate the package and a hold-down lid or cover to insure reliable electrical connections between the package circuit leads and the contact elements disposed within the housing. The assembly is characterized by the ease with which the housing may be attached to the interconnection medium, such as a printed circuit board, and the hold-down cover may be fastened to the connector housing. The latter are accomplished by a plurality of metal pins which protrude from the interconnection medium, penetrate the housing, and engage locking slots in the cover.

9 Claims, 5 Drawing Figures

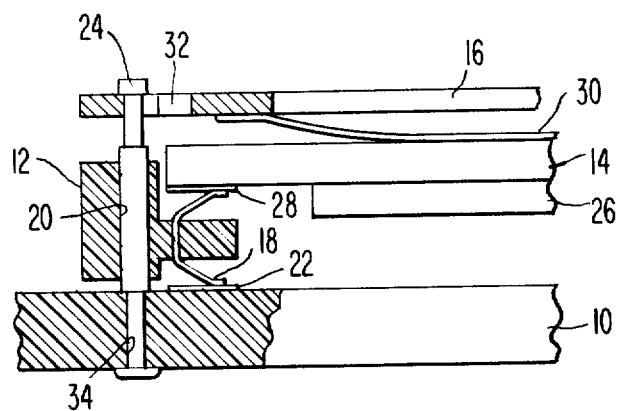
Fig.2
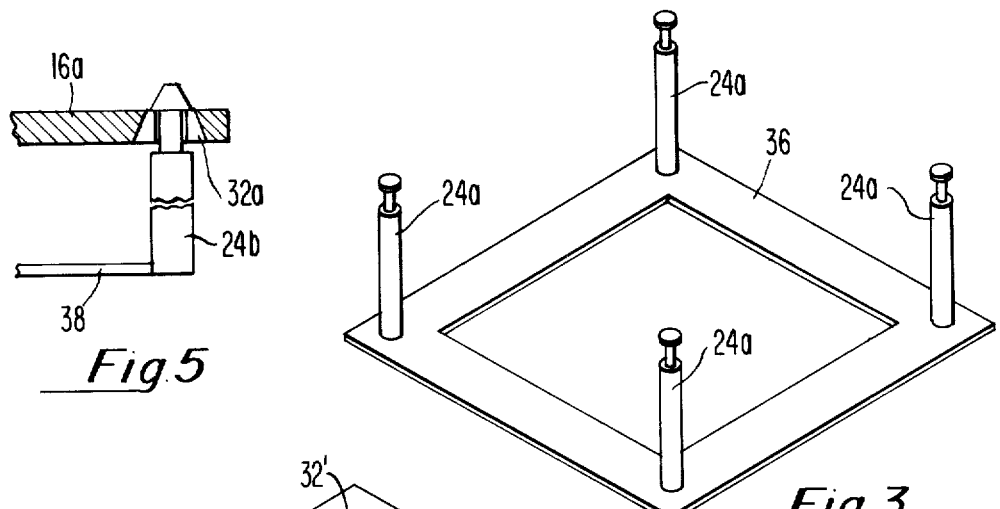
Fig.5
Fig.3
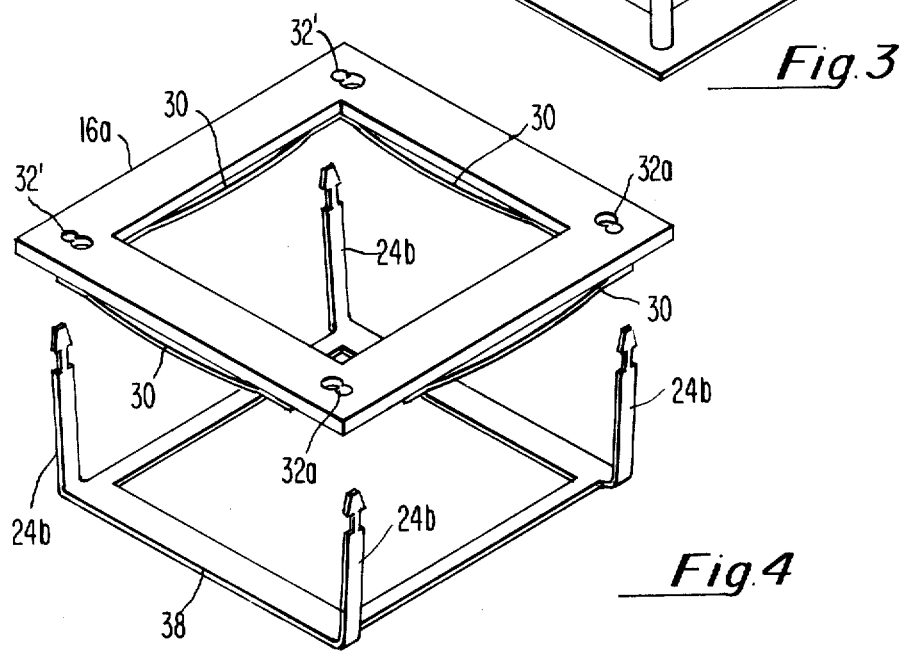
Fig.4

ELECTRICAL CONNECTOR ASSEMBLY FOR AN INTEGRATED CIRCUIT PACKAGE

BACKGROUND OF THE INVENTION

The trend in the electronics field is toward the use of increasingly high density integrated circuit (IC) packages of the LSI/VLSI types comprised of hundreds of electrically conductive interface (input/output) leads. The packages are generally designed to be mounted in a connector. The connector housing in turn must be attached to an interconnection medium, such as a printed circuit board. This attachment is often accomplished through the use of a screw and a threaded member disposed in the plastic insulative material of the connector housing. The lid or cover is fastened to the same material by a clip or hinge/clip assembly. In such attachments, the housing material may be subjected to excessive forces, which in combination with the high temperatures generated within the housing in LSI/VLSI operation, cause failure of the connector.

In view of the aforementioned problem in present day connector design, it is apparent that the need exists for a connector assembly in which the housing is subjected to minimal forces both as to its IC package hold-down device and to its mode of attachment to a printed circuit board. The connector assembly of the present invention fills such a need.

SUMMARY OF THE INVENTION

In accordance with the present invention, there is provided a connector assembly wherein improved means are provided to hold the assembly together and to attach it to an interconnection medium. While the connector finds particular application for LSI and VLSI packages having large numbers of input/output leads, the invention should not be considered so limited.

Basically the connector comprises a rectangular frame-like housing of insulative material for receiving the IC package. A plurality of electrical contacts disposed within the housing are homologously arranged to provide respective electrical circuit paths between the package leads and an interconnection medium such as a printed circuit board.

The connector housing includes a plurality of apertures positioned for example, adjacent the corners thereof. These apertures traverse the thickness of the frame-like structure and have their respective longitudinal axes oriented parallel to the planar sides of the housing.

The connector assembly also includes a metallic hold-down lid of planar configuration which has a plurality of spring-like members mounted on one of its surfaces. Additionally the lid includes a plurality of locking slots having a keyhole shape. These holes are positioned such that they will be in general alignment with the aforementioend apertures when the lid is placed on the housing.

Installation of the connector assembly requires a plurality of mounting pins emanating from the surface of the interconnection medium and positioned to enter the respective apertures in the housing. The housing is then placed over the pins, and an IC package is mounted therein. Each of the pins has a narrowed section adjacent to its head and the length of the pin is chosen such that the latter will protrude from the outer surface of the housing when it is fully seated on the interconnection medium. The lid is then positioned over the housing, with its spring-like members in contact with the IC package surface. Pressure on the lid causes the heads of the mounting pins to protrude through the lid locking slots where they may be captured in the respective narrow portions of the latter.

Other features and advantages of the present invention including the optional provision of a separate frame for supporting the mounting pins, and a variation in the pin structure itself to facilitate the assembly process, will become apparent in the detailed description of the invention which follows.

BRIEF DESCRIPTION OF THE DRAWING

FIG. 2 is a side view, partially cut away to illustrate the assembly of FIG. 1 in an operational state.

FIG. 3 depicts an alternate arrangement of mounting pins wherein the latter are supported by a common frame.

FIG. 4 depicts still another arrangement of mounting pins where the pins and frame are formed in one piece—the lid locking slots being conformed to this structure.

FIG. 5 illustrates a mounting pin of the type depicted in FIG. 4, caputred within a locking slot in a completed assembly.

DESCRIPTION OF THE PREFERRED EMBODIMENT

Figure 1:
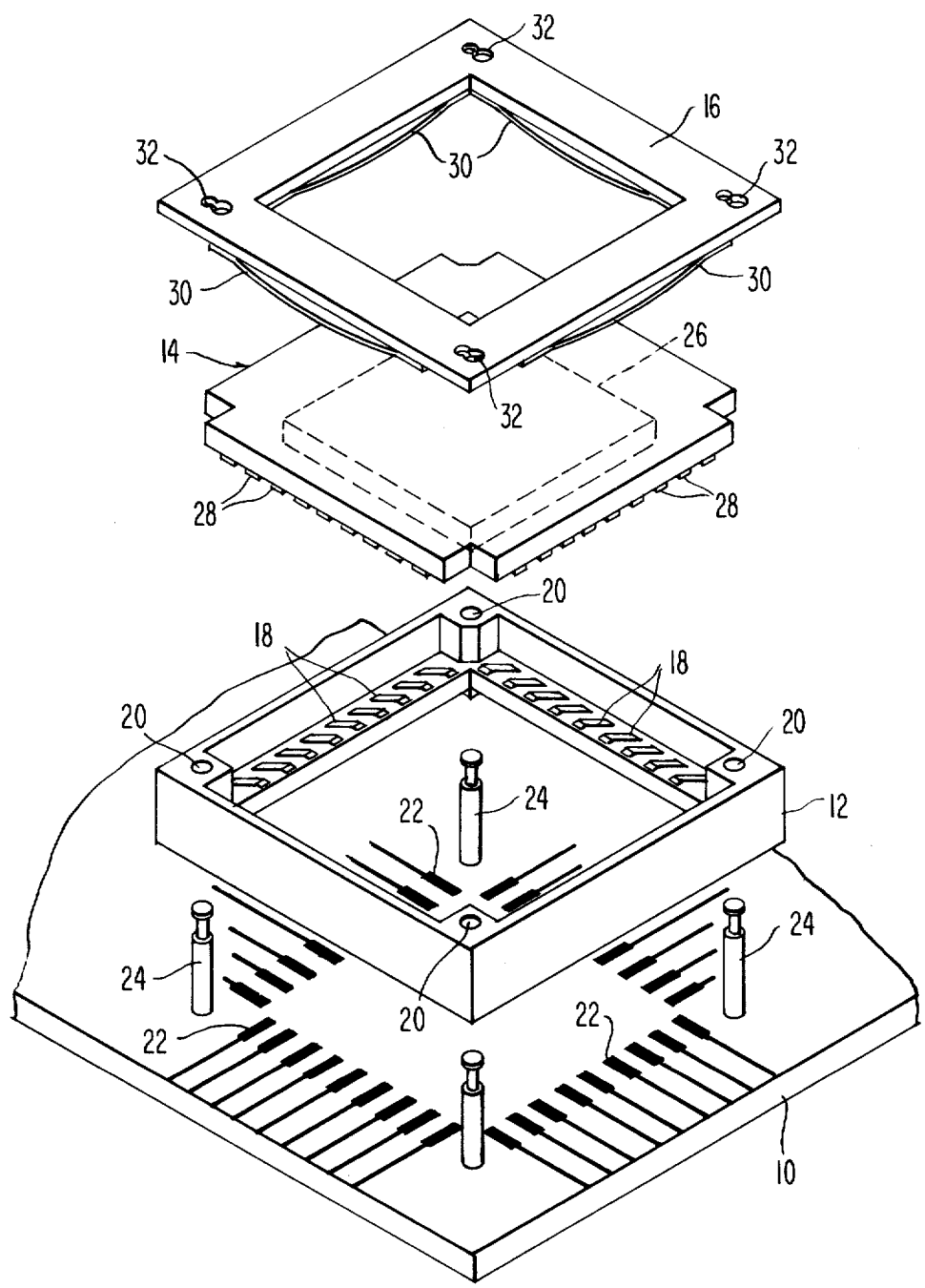
FIG. 1 is an exploded view of the connector assembly of the present invention.

In FIG. 1 there is illustrated in exploded fashion, an interconnection medium such as a printed circuit board 10, a connector housing 12 for receiving an IC package 14 and a hold-down lid 16. FIG. 2 depicts the IC package 14 operatively installed in a completed assembly.

With reference to FIGS. 1 and 2, the connector housing 12 is comprised of insulative material and includes a plurality of C-shaped electrical contacts 18. Each corner section of housing 12 has an aperture 20 disposed therein which traverses the thickness of the material. The printed circuit board 10 includes a plurality of electrically conductive pads 22 homologously arranged with respect to the housing contacts 18. Additionally, a plurality of metallic, generally cylindrical mounting pins 24 are shown emanating from the surface of board 10 and situated such that their respective longitudinal axes will be coincident with those of apertures 20 in housing 12, during assembly.

The IC package 14 with its chip enclosure 26 is adapted to be mounted within housing 12. The electrical leads 28 connected to the chip are positioned along the periphery of the package and are arranged to engage the electrical contacts 18 within housing 12. Finally the metallic frame-like lid 16 includes spring members 30 and a plurality of locking slots 32 of a general keyhole shape configuration. These slots 32 will be approximately coaxial with the apertures 20 in housing 12, during assembly.

With continued general reference to FIG. 1 and more particular reference to FIG. 2, the aperture connector assembly is prepared by providing apertures 34 in board 10 for receiving the respective mounting pins 24. In FIG. 2, the individual pins 24 are riveted to the board 10. However, as will be described hereinafter, the pins may be otherwise supported and merely inserted through apertures 34 in the board 10. The connector housing 12 is then placed on the pins 24— the latter entering apertures 20 and emerging from the outer surface of housing 12. The IC package 14 is then placed within housing 12. All four corners of the package 14 are notched to conform with the internal structure of housing 12, one corner being different from the rest to serve as a keying means. FIG. 2 illustrates the function of contacts 18 within housing 12, namely that of providing an electrical circuit path between the package leads 28 and the printed circuit board pads 22. Finally, the lid 16 is placed over the housing 12 with the large sections of the locking slots 32 in substantial axial alignment with the respective mounting pins 24. The springs 30 affixed to the underside of the lid 16 are brought to bear against the surface of the IC package 14. The lid 16 is then pressed toward the package 14 until the heads of the pins 24 protrude through the large diameter portions of the locking slots 32. As seen in FIGS. 1 and 2, a relatively small section of each pin 24 adjacent the head has a reduced diameter. Therefore, while pressure is maintained on the lid 16, it is shifted slightly, and the last mentioned pin section enters the narrowed portion of the locking slot 32, capturing the head of the pin. The lid may then be released, and it is locked in position. Removal of the IC package is easily accomplished by reversal of the installation procedure.

In FIG. 3, the mounting pins 24a are permanently mounted on a metallic frame 36 and are inserted simultaneously through apertures provided in the printed circuit board 10. The completion of an operative connector assembly is accomplished in the same manner as that described in connection with FIGS. 1 and 2. Since in the completed assembly, the pin supporting frame 36 merely rests against the surface of the board 10 and is not fastened thereto, pressure on the lid 16 and a shift to effect the release thereof from the mounting pins 24a, permits the entire assembly to come free, leaving the board 10 completely unencumbered. This is especially useful for board modifications necessitated by circuit design changes.

In FIG. 4, the mounting pins 24b and the frame 38 are formed in one piece from a sheet of metallic material capable of providing the pins 24b with at least limited spring action. The lid 16a differs from lid 16 shown in FIGS. 1 and 2 in the change in the orientation of two of the four locking slots designated 32a. The printed circuit board 10, the housing 12 and integrated circuit package 14 employed with the arrangement of FIG. 4 are assumed to be substantially the same as those of FIGS. 1 and 2. Each of the pins 24b is initially bent slighty outward, away from the frame 38, such that its longitudinal axis lies at an obtuse angle with the frame surface. In completing the assembly the pins 24b are inserted simultaneously into apertures 34 provided in the printed circuit board 10 in the same manner as those of FIG. 3. The housing 12 is then placed over the pins 24b which enter the apertures 20 in housing 12 and emerge from the outer surface thereof. The size of the apertures 34 and 20 in the board and housing respectively, are such that the pins 24b are able to retain their initial bent configuration. The IC package 14 is then placed within the housing 12. Finally, the lid slots 32' and 32a are aligned approximately with the heads of pins 24b and the lid 16a is pressed downward toward the package 14. As seen in FIGS. 4 and 5, the head of each pin is wedge shaped, resembling a blunt arrowhead. Immediately adjacent the head is an area of narrowed cross section. As seen particularly in FIG. 5, the large diameter portion of the slots 32' and 32a is tapered to form a conical surface. The latter tends to guide the head of a pin 24b into the large portion of the slot.

As continued pressure is exerted upon the lid, the heads of pins 24b protrude through the respective keyhole slots 32', 32a. As a result of the spring action of pins 24b, the narrowed sections thereof automatically snap into the corresponding narrow portions of the slots and the lid 16 is locked in place. Removal of the lid necessitates the application of pressure thereto directed toward the IC package and the manual movement of the heads of the pins 24b into the corresponding large diameter portions of the slots.

In conclusion, there has been disclosed a connector assembly which is well suited for present day high density packaging applications. It is apparent that depending upon the particular application, changes and modifications of the assembly may be required. Such changes and modifications, insofar as they are not departures from the true scope of the invention, are intended to be covered by the claims which follow.

What is claimed is:

1. A connector assembly for providing electrical circuit paths between an integrated circuit package and an interconnection medium comprising:

a housing for installing said integrated circuit package therein, said housing being comprised of at least a plurality of side members and having opposed external surfaces lying in respective parallel planes orthogonal to said side members, said housing having a plurality of apertures formed in said side members and connecting said external surfaces, a plurality of mounting pins disposed in said interconnection medium, said mounting pins entering respective ones of said plurality of apertures at one of said external surfaces of said housing, and exiting the other of said external surfaces, a lid including a plurality of spring members affixed to one surface thereof for applying pressure to said integrated circuit package installed in said housing, said lid having a plurality of locking slots homologously positioned with respect to said mounting pins, the application of external forces to said lid in at least the direction of said integrated circuit package causing said mounting pins to protrude through said locking slots and to be captured in the latter, said connector assembly remaining held together in unitary fashion upon the subsequent termination of said forces.

2. A connector assembly as defined in claim 1 further characterized in that said housing is a rectangular, frame-like structure, said apertures formed in said side members being situated adjacent respective corners thereof.

3. A connector assembly as defined in claim 2 further characterized in that each of said mounting pins has a narrowed section adjacent the head thereof.

4. A connector assembly as defined in claim 3 further characterized in that said locking slots have a keyhole configuration comprised of two contiguous openings of different size, the larger of said openings accommodating said head of said mounting pin, and the smaller of said openings receiving said narrowed section thereof.

5. A connector assembly as defined in claim 4 wherein said housing is fabricated of electrically insulative material, and said mounting pins and said lid are metallic.

6. A connector assembly as defined in claim 5 wherein each of said mounting pins is disposed in an aperture in said interconnection medium and permanently affixed to the latter, the longitudinal axes of said mounting pins being oriented at right angles to the surface of said interconnection medium and being coincident with the respective longitudinal axes of said apertures in said housing.

7. A connector assembly as defined in claim 5 further including a frame for supporting said mounting pins, said interconnection medium having a plurality of apertures for receiving said mounting pins, said mounting pins emanating from one planar surface of said interconnection medium, and said frame contacting the opposite planar surface of said interconnection medium.

8. A connector assembly as defined in claim 6 or 7 wherein said interconnection medium is a printed circuit board.

9. A connector assembly as defined in claim 7 wherein said mounting pins and said frame are formed in one piece from metallic material capable of providing said mounting pins with spring action, each of said mounting pins being initially bent away from said frame such that its longitudinal axis lies at an obtuse angle with the frame surface at its point of departure therefrom, the larger of said openings of said locking slots being tapered to present a conical surface to an incoming mounting pin thereby facilitating its entrance, said locking slots being oriented such that said narrowed section of a mounting pin automatically snaps into the corresponding smaller opening of said locking slots as its head emerges from the surface of said lid.

* * * * *